US006333460B1

(12) United States Patent
Toy et al.

(10) Patent No.: US 6,333,460 B1
(45) Date of Patent: Dec. 25, 2001

(54) STRUCTURAL SUPPORT FOR DIRECT LID ATTACH

(75) Inventors: Hilton T. Toy, Wappingers Falls, NY (US); Raed A. sherif, Woodland Hills, CA (US); David J. Womac, St. Charles, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/549,911

(22) Filed: Apr. 14, 2000

(51) Int. Cl.[7] .................................................. H01L 23/02
(52) U.S. Cl. .................. 174/52.4; 174/52.3; 257/704; 257/710; 257/778
(58) Field of Search ........................... 257/704, 710, 257/778; 174/52.2, 52.3, 52.4

(56) References Cited

U.S. PATENT DOCUMENTS 5,539,151 * 7/1996 Hamzehdoost et al. ........... 174/52.3
5,889,323 * 3/1999 Tachibana ......................... 257/704

* cited by examiner

Primary Examiner—Dean A. Reichard
Assistant Examiner—Hung V Ngo
(74) Attorney, Agent, or Firm—Tiffany L. Townsend

(57) ABSTRACT

An electronic chip assembly having the following components:
  a substrate having electrical conductors therein;
  an electronic circuit chip affixed face down to the substrate so as to make electrical connection to the conductors;
  a male framing member, compliantly adhered to the substrate;
  a lid having a female channel, the channel having sidewalls, the channel being disposed on or within said lid for receiving said male framing member; and
  sealant material disposed within the channel between the sidewalls of said channel and the female lid sealing member.

6 Claims, 4 Drawing Sheets

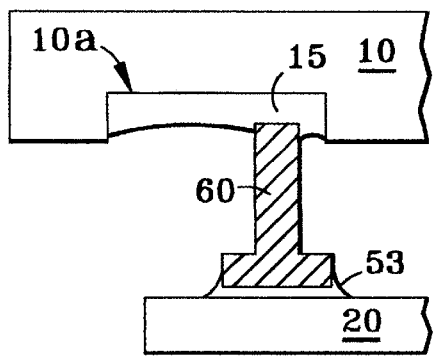
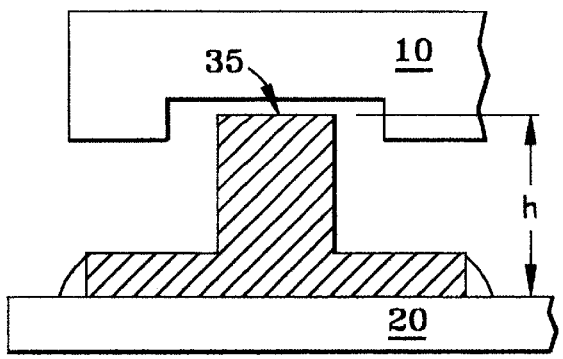
FIG. 2　　　　　　　　FIG. 2a
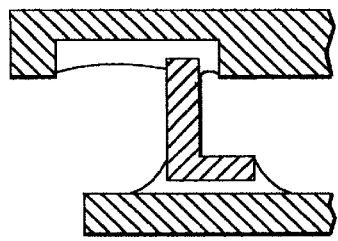
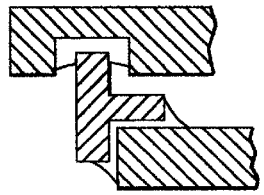
FIG. 2b　　　　　　　　FIG. 2c
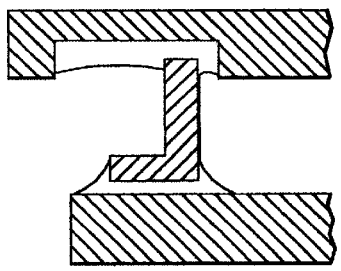
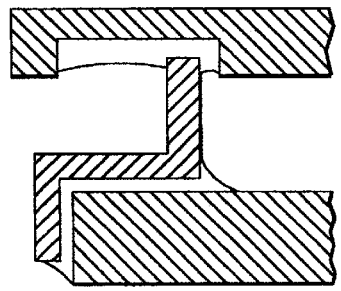
FIG. 2d　　　　　　　　FIG. 2e
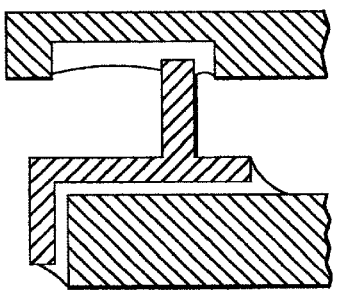
FIG. 2f

STRUCTURAL SUPPORT FOR DIRECT LID ATTACH

FIELD OF THE INVENTION

The present invention is generally related to semiconductor chip assembly and more specifically to methods for off loading mechanical load in solder connected semiconductor chips.

BACKGROUND OF THE INVENTION

The present invention is generally directed to an electronic chip assembly, which hereafter may also be referred to as a module, in which structural support is provided for a lid. More particularly, the present invention is directed to a structural support between the lid and substrate utilizing a curable material such as epoxy as a mechanism for off-loading mechanical load applied to the lid, particularly in those situations in which a compressive load is applied during chip operation. More particularly, the present invention is directed to an apparatus and method for supporting a lid through a 'u' channel which is bonded with a compliant adhesive to the substrate and which either retain the curable structural material for bonding to the lid or mate with the curable structural material that is retained in the lid, thereby providing a structural support configuration between the lid and substrate.

The present invention relates to semiconductor packaging for both single chip modules and multi-chip modules. One packaging technology employs chips that are disposed in the so-called flip-chip configuration. In this configuration small solder balls are affixed to an electronic circuit chip device at appropriate points on the device and the chip is affixed to and disposed against a substrate which contains electrical interconnections which correspond to and bond with the solder balls on the chip, thereby providing electrical signal paths to and from the chip device. Typically the packaging of devices in a flip chip configuration employs so called C4 or solder bump chip-to-substrate interconnection technology. In general, in flip-chip configurations, where chip cooling is necessary, which is typically the case, a lid or heat spreader is affixed to the back side of the chip. In these flip-chip configurations, a majority of the chip cooling is provided by means of access to the back side of the chip. Such cooling may be active or passive in nature, but the present invention is applicable in either case.

This packaging technology is typically employed for high end, high speed electronic circuit chip devices typically used in computer systems. Because of the high speed and high power requirements for these chip devices, it is very desirable to ensure that there is a low resistance thermal path between the chip and its lid. In particular, two approaches that are useable for the thermal interface between the chip and its lid include (1) adhesives and (2) solder.

High-end flip-chip package design also frequently utilizes land grid array (LGA) interconnection techniques between the substrate and the card or board. In order to ensure reliable, low electrical resistivity connections between interconnection pads on the bottom of the substrate and corresponding interconnection pads on the top of the card via a compressible electrically conductive interposer, (hereafter referred to as an LGA socket), the module is typically clamped against the card during normal chip operation, (hereafter, said clamping is referred to as the LGA socketing load). Accordingly, it is very desirable to employ lid attachment mechanisms and structures which not only provide a reliable highly conductive thermal path but which also distribute this load across the lid and substrate in such a manner as to not negatively impact the structural integrity of the thermal interface, the chip, its interconnections, or the substrate.

Accordingly, it is seen that modules that have lids of Al, Cu, CuW, AlSiC, SiC, CuSiC, AlN, diamond, graphite, or other composite materials which are directly attached to a chip with adhesive or solder should employ structural support, at the module level, so as to prevent damage to the chip, its interconnections, the substrate, or the thermal interface. When the module uses LGA substrate-to-card interconnections and the LGA socketing load is applied through the lid, a lid support mechanism is desired so as to distribute the mechanical LGA socketing load through the supports, thus avoiding transmission of the full load through the chip itself and avoiding high substrate internal stresses.

However, it is noted that there are several features that any solution to this problem should address. In particular, it is noted that whatever mechanism is provided for this load distribution, it should fit within a low profile region having a thickness of less than approximately 1.0 mm between the lid and the substrate. Furthermore, the structure provided should be rigid after the lid is attached. Additionally, it is noted that there are requirements for a certain degree of compliance in the lateral direction as result of mismatches of thermal expansion between the materials employed within the structure. Specifically, there is a thermal expansion matching goal with respect to the lid and the substrate. In addition, the module structure employed should be able to support heavy (in the present context) lids. Accordingly, it is desirable to provide a rigid lid and a support structure which is rigid in the axis of the LGA socketing load and compliant in other planes. This structure would also be applicable in situations where there is a large heatsink weight. Again, the load from the lid and the heatsink would be off-loaded from the chip to the structural support. In addition, the structure can support an integral lid and heatsink design.

SUMMARY OF THE INVENTION

Accordingly, it is an object of the present invention to provide structural support for a lid which is directly attached to an electronic integrated circuit chip device.

It is a object of the present invention to provide a structural support mechanism which is compliant in a lateral direction while at the same time being rigid in the direction normal to the lid and substrate.

It is a still further object of the present invention to provide a load bearing support which permits lateral differential expansion and contraction between lid materials, substrate materials, and chip materials due to differences in thermal coefficients of expansion and differences in thermal excursions.

It is yet another object of the present invention to provide a load bearing structure which is particularly suitable for the utilization of copper as a lid material.

It is also an object of the present invention to provide a lid support and attachment mechanism which will prevent damage to the substrate and is compatible with a glass ceramic substrate.

It is also an object of the present invention to provide a lid support and attachment mechanism which will prevent damage to the substrate and is compatible with an AlN substrate.

It is also an object of the present invention to prevent damage to circuit chip devices and to promote the utilization of LGA interconnection techniques for interconnection between the module and the card/board.

Lastly, but not limited hereto, it is an object of the present invention to provide improved thermal and mechanical packaging systems and materials for single chip and multi-chip modules.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 2 and 2a are cross sectional views of one embodiment of the instant invention FIGS. 2b–2g are alternate forms of the embodiment of the invention shown in FIG. 2.

DESCRIPTION OF THE PREFERRED EMBODIMENTS

Figure 1:
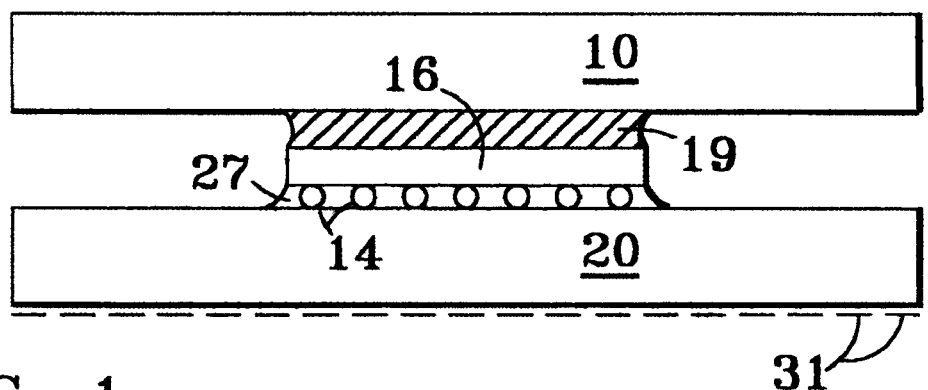
FIG. 1 is a side elevation view illustrating a problem solved by the present invention.
Figure 1A:
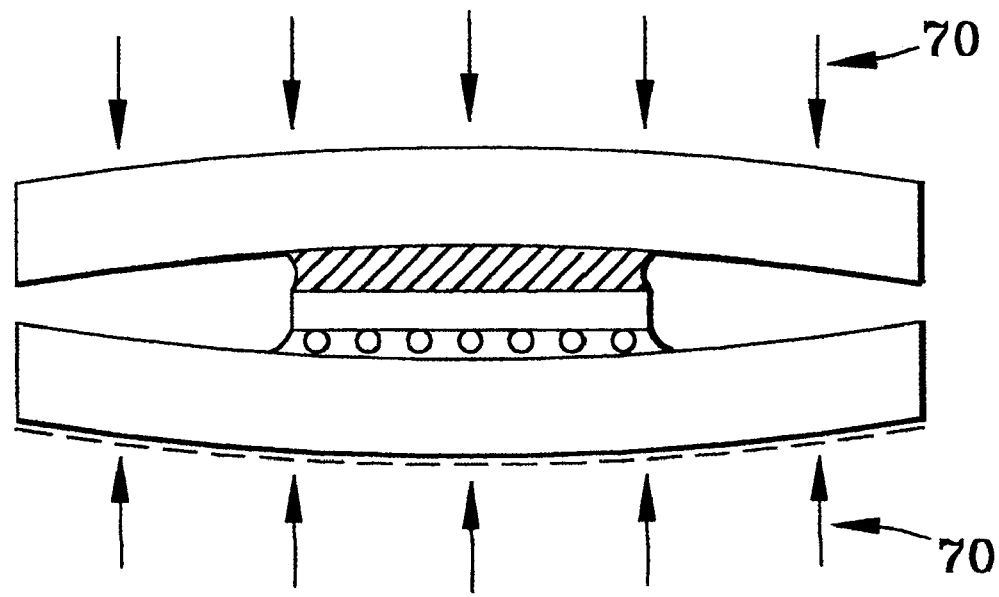

FIG. 1 illustrates the problem discussed herein. In particular, chip, 16, having solder balls affixed to its face-down side is thereby connected electrically to conductors on and within substrate 20 which typically comprises a multi-layer organic or inorganic structure having LGA pads 31 for electrical connection to a circuit board or backplane. It is also noted that underfill material 27 is also provided between chip 16 and substrate 20. It is the solder balls arranged between chip and substrate pads (not shown) on chip 16 which provide the electrical interconnection between chip 16 and substrate 20.

With increasing density of electronic circuit components on chips such as chip 16, there is an increase in problems associated with heat removal from the chip. This heat removal problem is also aggravated by the desire to operate chips such as chip 16 at ever increasingly higher frequencies. It is desirable to place a heat sink onto the lid but that exerts a force on the substrate and the lid.

In preferred embodiments of the present invention, as well as in the structure shown in FIG. 1, it is very desirable to provide a structure which is capable of withstanding a force exerted against lid 10 such as that shown by load 70 in FIG. 1. It should be noted that the bending associated with the load in FIG. 1 is exaggerated for clarity. In particular, in normal chip operation it is desirable in some technologies to apply a continuous load to the module structure so as to provide secure, continuous and low electrical resistance contact between substrate LGA pads and the LGA socket. It is undesirable to transfer all of this load to the center of the substrate 20 via the chip; doing so will cause the lid and substrate to bend as shown in FIG. 1 and stress the thermal interface, chip, solder balls, and chip underfill. Accordingly, to achieve the mutually desired goals of good load distribution and thermal conduction integrity there is provided the structure shown in FIG. 2. The 't' frame 60 is used to provide structural support between the lid and substrate. In FIG. 2 the 't' frame 60 is attached to substrate 20 by a compliant adhesive material 53. The lid 10 is attached to 't' frame, 60, and provides the only structural communication between the lid and substrate. In other words there are no standoffs or other mechanical elements between the substrate and lid. A rigid adhesive material is dispensed in the lid 10a cavity and thereafter cured or hardened. The compliant adhesive material allows for movement in all planes and can adapted for multiple tolerances within the substrate/lid coupling. Examples of compliant adhesive materials include certain epoxies, elastomers, polymers, adhesives, or silicones. Sylgard 577(™) elastomer material made by Dow Corning is an example of a compliant material that allows for compliance in the lateral directions(x-y) in a module assembly. This material is a flexible elastomer which will yield, provide compliance, and not be damaged during expansion and contraction of various CTE(coefficient thermal expansion) and mismatched components. By mismatched components it is meant ceramic vs non-ceramic materials. The "t" frame allows for a wider range of lid sizes on a substrate. As shown in FIGS. 2 and 2a, the cavity, 10a, in the lid, 10, can be at least about 3 times as wide as the base of the frame, 35. This would allow for movement of the lid in the x-plane prior to the epoxy, 15, hardening. The design in this embodiment also allows for tolerance in the vertical direction during lid placement. As the lid, 10, is attached, it is possible to confidently apply pressure without concern that the chips on the substrate (not shown) will be detrimentally affected. As long as the height, h, of the "t" frame is at least equal to the height of the chips on the substrate then the lid will not be contact the chip during the attachment of the lid to the substrate. The height, h, of the "t" frame should be measured from the side that is in contact with the compliant adhesive on the top surface of the substrate, 20, to the side that is in contact with the rigid epoxy on the lid, 10. FIGS. 2b–2g show alternate shapes for the "t" frame.

Figure 3:
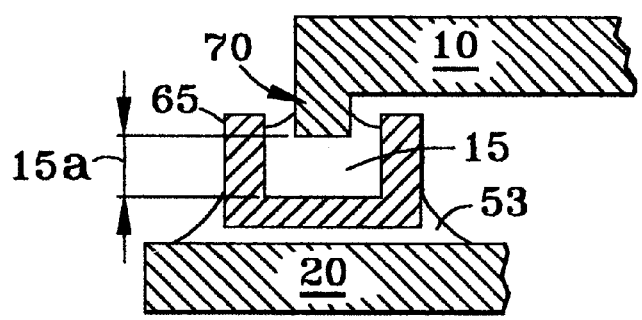
FIGS. 3, 3a and 3b are cross sectional views of another embodiment of the instant invention.
Figure 3A:
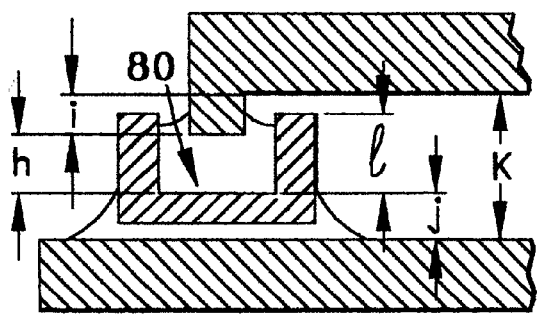
Figure 3B:
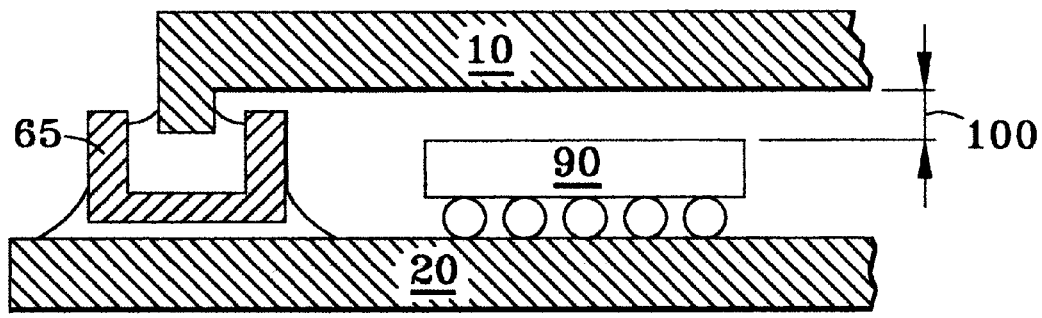

In another preferred embodiment as shown in FIG. 3, the 'u' channel 65 is used to provide structural support between the lid and substrate. The substrate 20, and lid 10 are assembled the same way as FIG. 2. In FIG. 3 the 'u' channel 65 is attached to substrate 20 by a compliant adhesive material 53. An extension of the lid, 70, a leg, is disposed in the 'u' channel and attached with the rigid adhesive, 15. The 'u' channel embodiment has all of the advantages of the 't' frame design. Both the 'u' cannel and the 't' frame designs take into consideration the chip height. Additionally, both designs allow the lid to find a final position prior to the rigid adhesive application. As shown in FIG. 3a, both the substrate adhered 'u' channel and the lid contribute to the height of the space k, that will accomodate the chips. The lid contribution is represented by i, where i is the length of the leg of the lid. The substrate contribution is represented by j, where j is the height from the surface of the substrate to the bottom of the inside of the 'u' channel, 80. The minimum adhesive fill quantity in a channel, 80 is represented by h. A minimum adhesive fill is necessary to obtain a good load bearing structure. The minimum amount of adhesive is a user determined amount based on the size of the channel, 80, and the shape of the leg of the lid. The minimum amount of adhesive should ensure a rigid surface for the leg. Therefore as long as h+i+j at least equals the minimum user calculated value of k then each placement of lid on substrate, 20, in 'u' channel, 65, would not cause detrimental damage to the underlying chips. The variation could be at most about '1', which is the height of the sidewall of the 'u' channel as shown in FIG. 3a. FIG. 3b shows the relationship between the chips and the lid in this embodiment. The force exerted by minimizing the thermal gap, 100, between the chip, 90, on the substrate, 20, and the lid, 10 is well within the acceptable load for chips and minimization of the thermal gap, 100, could occur. By thermal gap it is meant the distance between the top of the chips on a substrate and the bottom of the lid.

Figure 4:
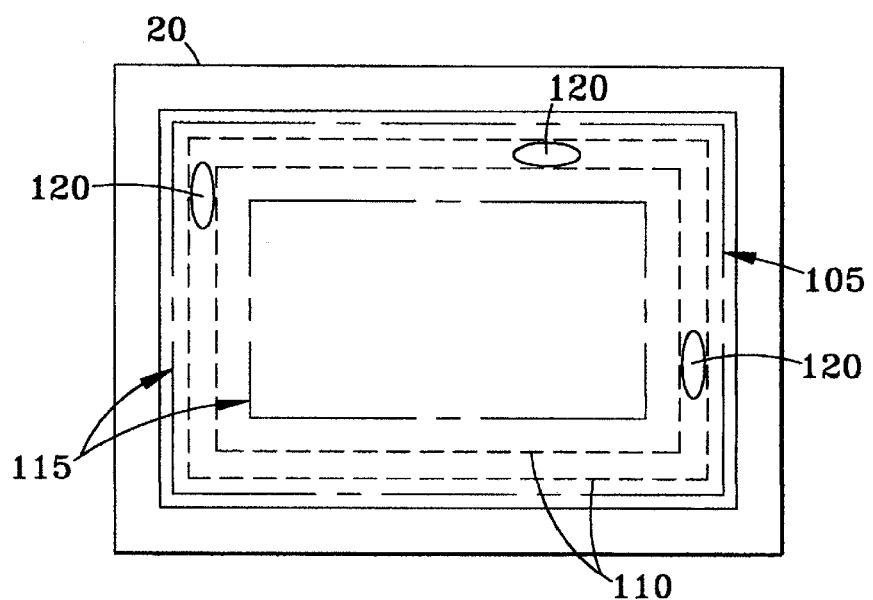
FIG. 4 is a top-down view of a lid of both embodiments of the instant invention.

A top view of one embodiment of the 'u' channel lid is shown in FIG. 4. As identified in FIG. 4 the lid edge, 110, would sit between the inner side of the 'u' channel, 115, and the outer side of the 'u' channel, 105. The 'u' channel is compliantly adhered to the substrate, 20. The channel would have to be filled with the curable rigid epoxy prior to the placement of the lid on the chip containing substrate. The openings in the lid, 120, would not be present in this embodiment. The quantity of epoxy deposited would have to be monitored if overflowing of the curable epoxy could negatively effect chip performance.

Figure 5A:
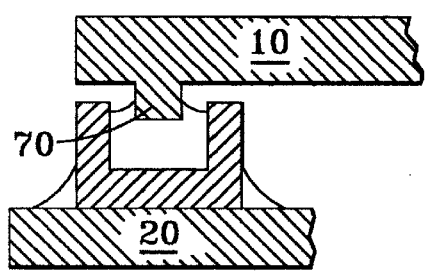
FIGS. 5a and 5b are cross sectional views of alternate forms of the embodiment of the invention shown in FIG. 3.
Figure 5B:
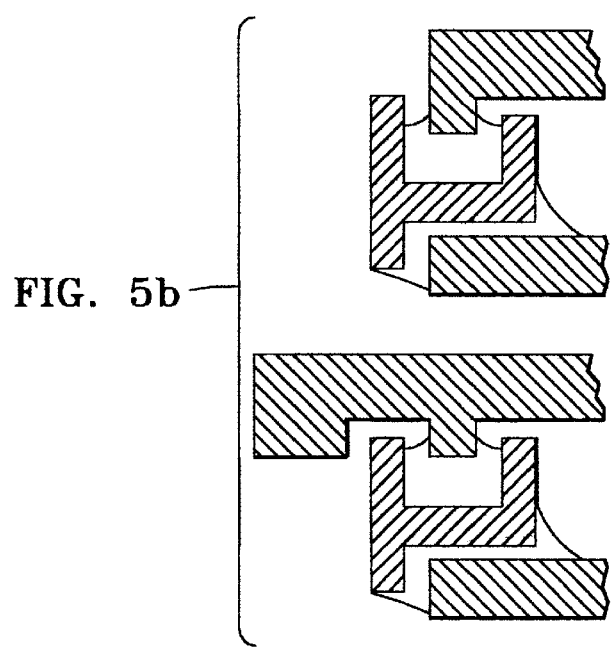

In an alternate lid design, also shown in FIG. 4, the lid would have a plurality of opening for dispensing the epoxy once the lid was already disposed in the 'u' channel. As seen in FIG. 4 there is in this embodiment are multiple openings, 120, in the lid, 10, which can provide access for filling the 'u' channel after the lid has been placed. Preferably, but not necessarily, the lip of the lid would be discontinuous and the lip would not be present where there was an opening. As can be imagined by those skilled in the art there are a number of different lid designs that can be used in this invention. As shown in FIG. 4, the leg, 70, of the lid, 10, can be at the edge of the lid or the leg can be interior as in FIG. 5a. Also, there are a number of variations for the shape of the 'u' channel, an exemplar is shown in FIG. 5b. The method and structure of the instant invention can accommodate a number of lid designs.

Accordingly, the present invention provides a structure with a rigid adhesive as a solid support which attaches a lid to an underlying substrate, which includes a land grid array structure. In particular, the present invention provides structural support for a direct lid attach module so as to prevent substrate stress cracking in spite of LGA socketing loads. Additionally, the load on the thermal interface is also reduced. Also, the use of compliant adhesive to secure the frames to the substrate allows for movement in all directions. All of the above permit the utilization of relatively heavy heat sinks to further enhance solutions to thermal problems. Furthermore, damage from impact shock and vibration to the bonded thermal interface and chip is reduced as is the potential for damage during chip structure or module handling and LGA socketing. Accordingly, from the above it should be appreciated that all of the objectives recited herein have been met by the structure described.

While the invention has been described in detail herein in accordance with certain preferred embodiments thereof, modifications and changes therein may be effected by those skilled in the art. Accordingly, it is intended by the appended claims to cover all such modifications and changes as fall within the true spirit and scope of the invention.

The invention claimed is:

1. An electronic chip assembly, said assembly comprising:

a substrate having electrical conductors therein;

an electronic circuit chip affixed face down to said substrate so as to make electrical connection to said conductors;

a male framing member, compliantly adhered to the substrate;

a lid having a female channel, the channel having sidewalls, said channel being disposed on or within said lid for receiving said male framing member; and sealant material disposed within said channel between said sidewalls of said channel and said female lid member.

2. The chip assembly of claim 1 in which said channel extends in a path around said chip.

3. The chip assembly of claim 2 in which said path is closed.

4. The chip assembly of claim 1 wherein the male framing member has a 't' shaped cross section.

5. The chip assembly of claim 1 wherein the sealant material creates a rigid seal.

6. The chip assembly of claim 5 wherein the sealant material is a rigid epoxy.

* * * * *